US006766741B1

(12) United States Patent
Fina

(10) Patent No.: US 6,766,741 B1
(45) Date of Patent: Jul. 27, 2004

(54) INKING PLATE FOR ROTARY PRINTING MACHINE

(75) Inventor: Raffaele Fina, Lausanne (CH)

(73) Assignee: KBA-Giori S.A., Lausanne (CH)

( * ) Notice: Subject to any disclaimer, the term of this patent is extended or adjusted under 35 U.S.C. 154(b) by 0 days.

(21) Appl. No.: 10/130,637

(22) PCT Filed: Sep. 28, 2000

(86) PCT No.: PCT/CH00/00529

§ 371 (c)(1), (2), (4) Date: May 18, 2002

(87) PCT Pub. No.: WO01/38096

PCT Pub. Date: May 31, 2001

(30) Foreign Application Priority Data

Nov. 19, 1999 (CH) ............................................. 2117/99

(51) Int. Cl.[7] ........................... B41N 1/12; B41N 10/04; G03F 7/00

(52) U.S. Cl. ..................................... 101/401.1; 101/376

(58) Field of Search ................................ 101/368, 395, 101/375, 376, 401.1, 352.1, 352.11, 352.13, 351.6, 153, 170, 328, 329, 330; 430/306

(56) References Cited

U.S. PATENT DOCUMENTS

| | | | | | |
|---|---|---|---|---|---|
| 3,991,673 | A | * | 11/1976 | Coale et al. | 101/395 |
| 4,388,865 | A | * | 6/1983 | Kellner | 101/401.1 |
| 4,871,631 | A | * | 10/1989 | Pieper et al. | 430/14 |
| 5,074,209 | A | * | 12/1991 | Prittie | 101/395 |
| 5,749,298 | A | * | 5/1998 | Castelli et al. | 101/415.1 |
| 5,771,809 | A | * | 6/1998 | Hecht | 101/401.1 |
| 5,798,202 | A | * | 8/1998 | Cushner et al. | 430/306 |
| 5,804,353 | A | * | 9/1998 | Cushner et al. | 430/306 |
| 6,158,345 | A | * | 12/2000 | Gelbart | 101/485 |
| 6,159,659 | A | * | 12/2000 | Gelbart | 430/306 |
| 6,223,655 | B1 | * | 5/2001 | Shanbaum et al. | 101/395 |
| 2003/0033948 | A1 | * | 2/2003 | Buono et al. | 101/395 |

* cited by examiner

*Primary Examiner*—Andrew H. Hirshfeld
*Assistant Examiner*—Leo T. Hinze
(74) *Attorney, Agent, or Firm*—Bugnion S.A.; John Moetteli

(57) ABSTRACT

An inking plate for a rotary printing machine mounting on a cylinder is provided. The inking plate is formed of at least a base plate (11) and a PVC composition material of at least one layer (15; 27) deposited on said base plate (11) over a majority of the surface of the base plate (11). The surface of the deposited material is designed to be cut so as to define relief surfaces (16) having limits corresponding to the outlines of surfaces to be inked. The cutting of the deposited material occurs when the base plate (11) is held in a cylindrical form so as to permit mounting on the cylinder without substantial deformation, from an as-cut state, of the base plate (11) or the deposited material.

3 Claims, 4 Drawing Sheets

INKING PLATE FOR ROTARY PRINTING MACHINE

BACKGROUND OF THE INVENTION

The present invention relates to an inking plate for a rotary printing machine, the plate being designed to be mounted on a cylinder, and being formed of at least a base plate and material deposited on the plate, the material being designed to be cut in relief areas which define the surfaces to be inked. The present invention also relates to a printing machine comprising such a printing plate mounted on a cylinder and a method for producing such a plate.

These inking plates mounted on inking cylinders are known in the case of rotary printing machines, both for direct and indirect printing. In the case of indirect inking, the necessary ink is transferred to an inking/collecting cylinder from separation cylinders, also known as inking cylinders. Each of these inking cylinders is associated with a particular ink duct and consequently with a given color. The collecting cylinder then transfers the ink corresponding to the various colors to the printing plates. In the case of direct inking, on the other hand, the ink is transferred to the printing plates directly from the inking cylinders, without using a collecting cylinder.

The inking cylinders, in a manner known in the prior art, have a surface made of a hard material, e.g. plastic, metal or hardened rubber, this surface being cut in such a way as to form relief areas whose limits define the areas to be printed in a given color. These relief areas are formed by known cutting means, such as laser.

Such inking rollers are described for example in European patent application EP 0 406 157 and in U.S. Pat. No. 5,282,417 which shows such inking rollers mounted on a printing machine using both direct and indirect printing techniques.

This type of inking cylinder nonetheless has disadvantages. In particular, once they become worn, that is when the relief areas are worn down, it is necessary to remove the cylinders from the printing machine, redeposit a layer of plastic or other material on its circumference, re-cut the desired relief areas and finally refit the cylinders in the machine, which requires time-consuming and complicated adjustments to reestablish correct registration of the different impressions on the collecting/inking cylinder or on the plate cylinder.

One way of overcoming some of these disadvantages is to use inking plates with a photopolymeric coating which are then mounted on cylinders replacing the known inking cylinders. These plates can therefore be prepared independently, notably by forming the relief areas by a photogravure process, but these photopolymeric plates have disadvantages of their own. In the first place there is the fact that the relief areas have to be generated flat, which means that these relief areas are deformed when the plates are mounted on the cylinder. It is therefore essential to take account of this deformation while generating the relief areas. In addition, the diameter of the cylinders on which the plates will be mounted also has an influence on the deformation. Besides their cost, these photopolymeric plates also have a short life. In fact, particularly in processes that use the principle of direct inking of the printing plate, the temperature of which may be high, photopolymeric plates have a much shorter life than the inking cylinders mentioned above. Furthermore, the photopolymeric material has poorer elasticity than the materials used for inking cylinders and inking is therefore sometimes inadequate, especially in a direct-inking process.

It is an object of the invention to improve the known inking systems.

More particularly, it is an object of the invention to propose an inking plate that overcomes the problems of known plates.

It is also an object of the invention to propose a process for producing such an inking plate, an inking cylinder carrying such an inking plate and a rotary printing machine using such an inking plate.

The inking plate according to the invention is defined by the cutting of the reliefs in a hard deposited material occurring when the base plate (11) is held in a rounded condition so as to permit mounting on the cylinder after cutting without substantial elastic deformation of the base plate (11) or the deposited material from its as-cut state.

There are many advantages to the plate according to the invention. In the first place there is the fact that such plates are much less expensive to produce and they last much longer than photopolymeric plates. In addition, they are much simpler to manufacture because the relief areas are generated on plates mounted on cylinders, so that these areas are not deformed when the plates are installed in a printing machine.

In further embodiments, the inking cylinder for a printing machine comprising at least one printing plate according to the invention.

In another embodiment, a process for producing a plate according to the invention is provided.

BRIEF DESCRIPTION OF THE DRAWINGS

A clearer understanding of the invention will be gained from the description of an embodiment thereof and of the figures relating thereto.

DETAILED DESCRIPTION OF THE PREFERRED EMBODIMENT(S)

Figure 1:
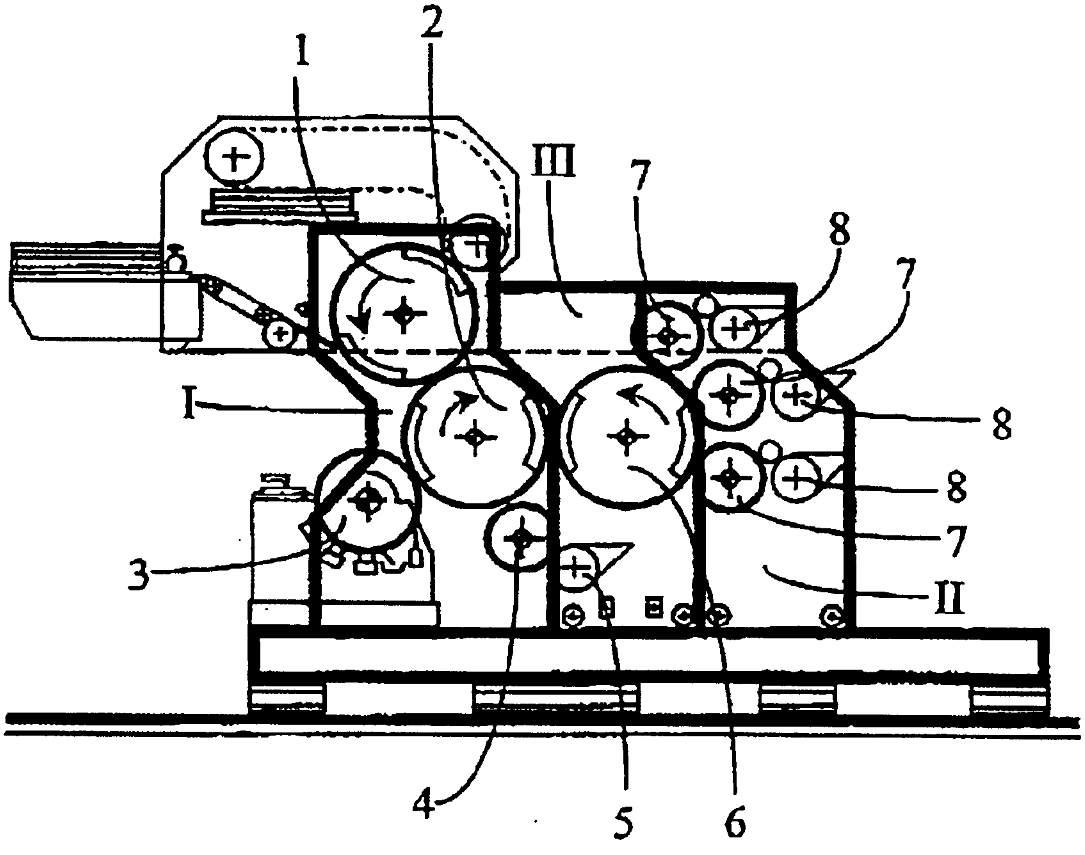
FIG. 1 is a schematic cross section through a rotary printing machine using both direct and indirect inking techniques.

Referring now to FIG. 1, a convertible intaglio printing machine is shown that allows the use of a direct or indirect inking process. This machine comprises three modules I, II and III, direct inking being performed in module I which comprises an impression cylinder 1, a plate cylinder 2, wiping cylinder 3 and an inking cylinder 4 with an associated ink duct 5. Indirect inking uses modules II and III, which comprise a collecting/inking cylinder 6 inked by inking cylinders 7 located in module II with associated ink ducts 8. For indirect inking, therefore, designs corresponding to the relief areas of the inking cylinders 7 are gathered on the collecting/inking cylinder 6 before being transferred from this collecting cylinder 6 to the plate cylinder 2. A rotary printing machine of this kind is known from U.S. Pat. No. 5,282,417, for example, which is incorporated by reference in this application.

Figure 2:
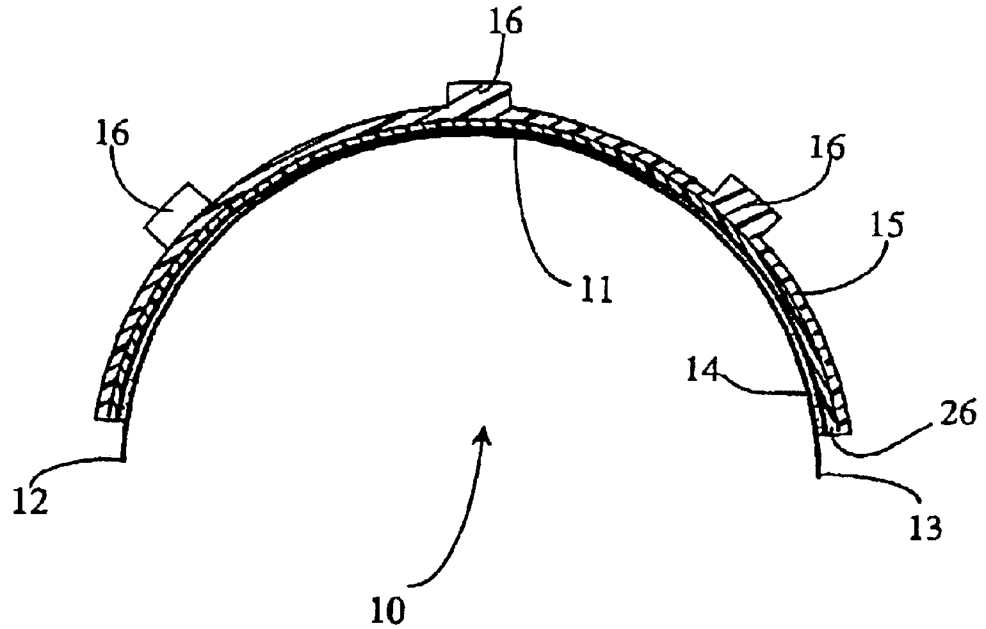
FIG. 2 is a cross section through a plate according to the invention.

Now referring to FIG. 2, an inking plate according to the invention is shown in section view. This inking plate 10 is made up of a base plate 11, preferably of a metal such as stainless steel, with two ends 12, 13 for clamping it to a cylinder 20 (see FIG. 3). The base plate 11 is first given a layer of adhesive 14 which covers the exterior surface of the plate 11 except for the two ends 12, 13 used for clamping purposes. On top of this layer of adhesive 14, a first layer 26 of a first PVC composition is deposited, and on top of this first layer 26 a second layer 15 of a second PVC composition in which reliefs 16 are cut. These reliefs 16 correspond exactly to designs on the plate which must be inked in one particular color.

This plate with its two PVC layers is preferably used for direct inking, the second layer 15 being softer than the first layer 26 of PVC.

Figure 3:
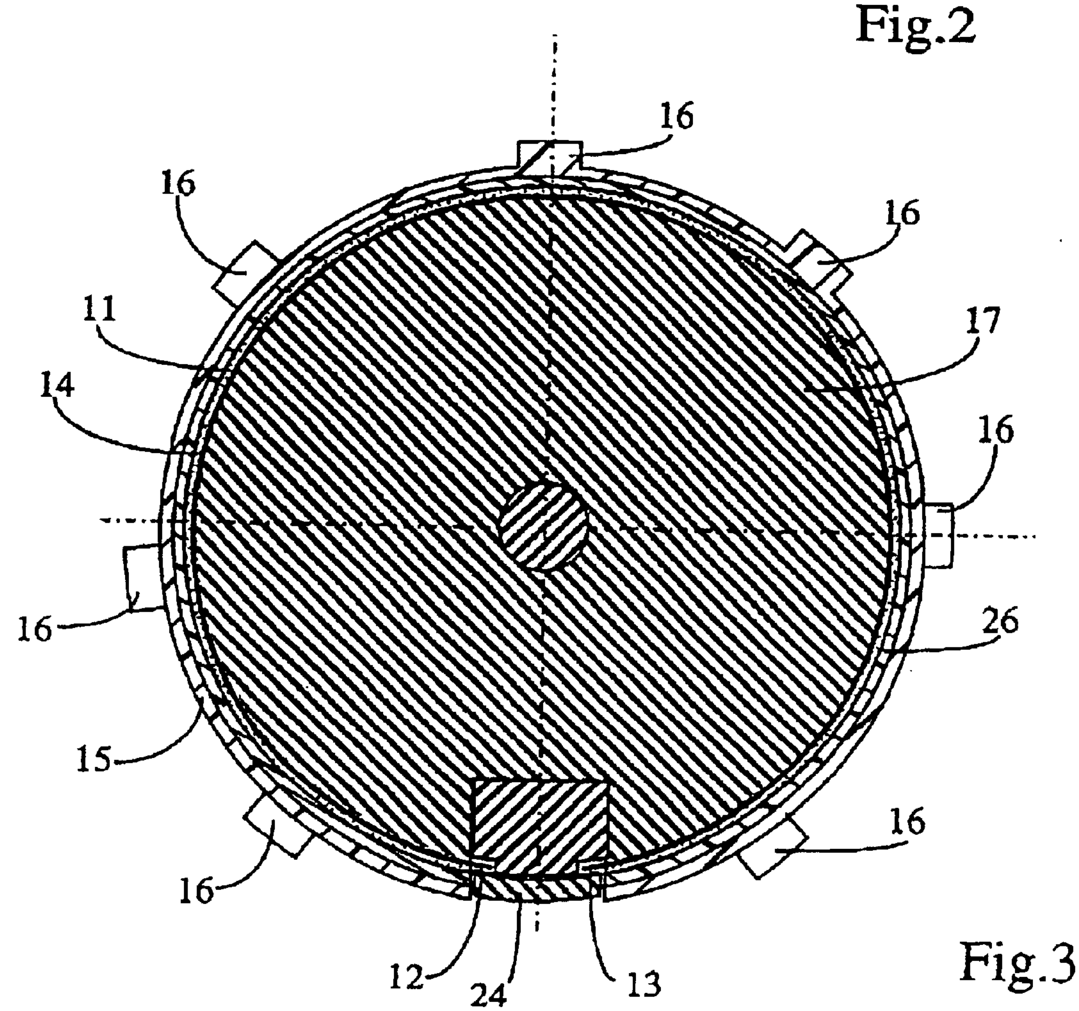
FIG. 3 is a cross section through an inking cylinder carrying a plate according to the invention.

FIG. 3 illustrates in schematic form the inking plate 10 mounted on an inking cylinder 17. The plate 10, which corresponds to that in FIG. 2, comprises the base plate 11, the layer of adhesive 14, and both layers 26 and 15 of PVC, reliefs 16 having been cut into the layer 15. The ends 12 and 13 of the base plate 11 are held in a slot in the cylinder 17 by an appropriate clamping system, e.g. grippers (not shown). The system by which plates are clamped to a cylinder is known in the field of rotary printing machines. As an example, patent EP 0 403 434, which is incorporated by reference in this application, shows one such clamping system mounted in the slot of a plate cylinder.

An inking cylinder 17 such as this is then mounted in a printing machine such as that shown in FIG. 1, preferably in place of the direct-inking cylinder 4 as indicated above.

Figure 4:
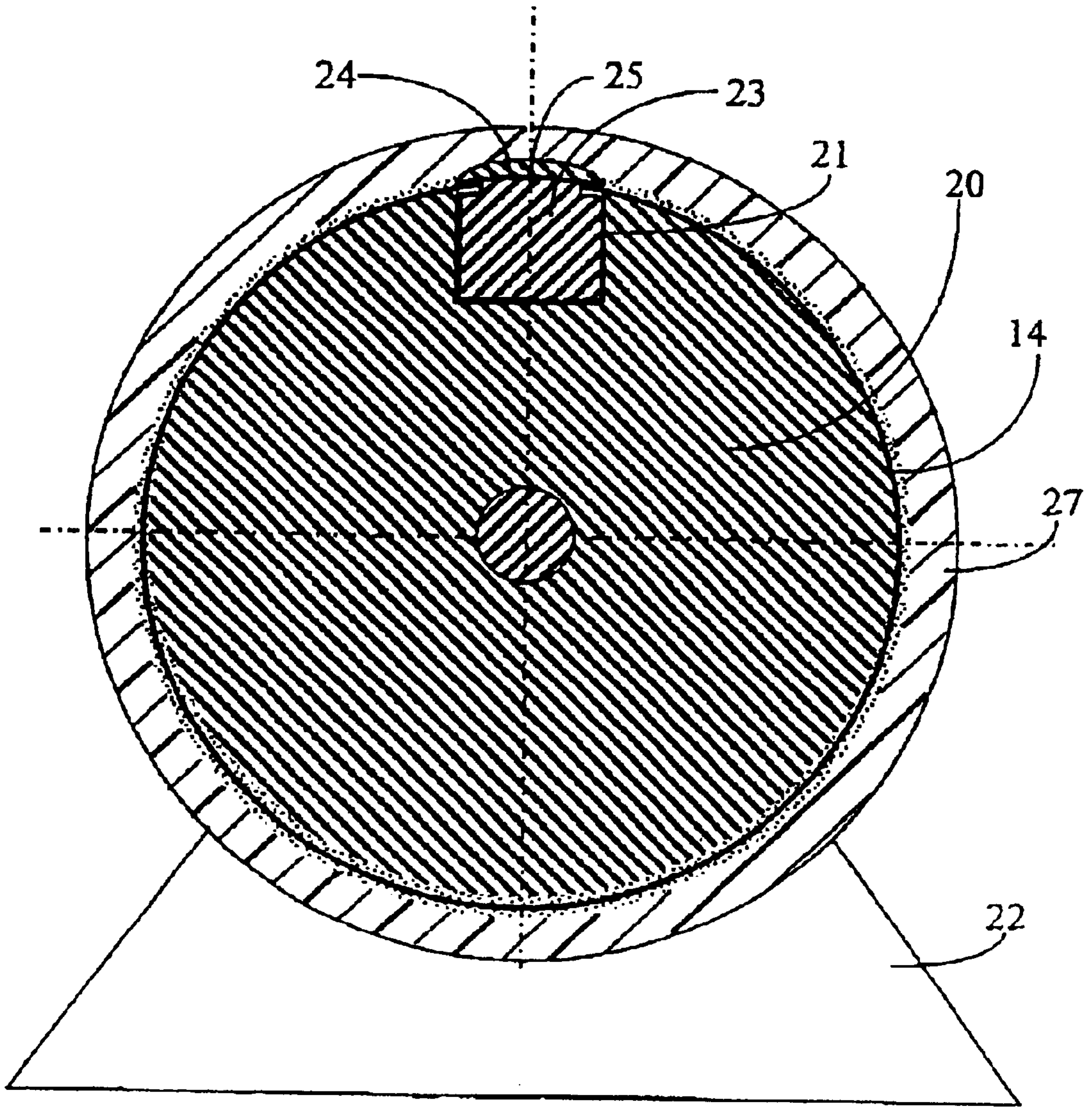
FIG. 4 shows a cross section through a base plate mounted on a preparation cylinder for the deposition of the layers.

FIG. 4 shows an inking plate being prepared. It is mounted on a preparation cylinder 20 suitable for depositing the successive layers, said cylinder being mounted on a support 22. The base plate 11 is mounted on this preparation cylinder 20 and held in position by a system of grippers, shown diagrammatically by the reference 23, situated in the slot 21 of said cylinder 20. The system of clamps employed may be that described above or any other equivalent system. Said slot 21 is then closed by a cover 24 to prevent the adhesive and PVC entering it. The cover 24 is fastened with screws 25 or other equivalent means. The layer of adhesive 14 is deposited on the surface of the base plate 11 except over the surface of the cover 24. In the case shown in this figure, only one layer of PVC 27 has been deposited: this plate configuration corresponds to it being used in an indirect inking process. In this situation, the outer layer of PVC 27 is harder than the layer 15 seen in FIGS. 2 and 3, for plates used in a direct inking process. The absence of adhesive on the cover 24 means that the layer of PVC does not adhere to it, and in order to remove the plate 10 the PVC is simply cut lengthwise in the axial direction of the cylinder 20, along the edges of the cover to remove the layers of PVC covering the said cover 24. The fasteners of the cover 24 can then be undone to give access to the clamping means 23 used to clamp the plate 10 to the cylinder 20 so that the plate 10 can be removed.

The reliefs 16 can be cut (see FIGS. 2 and 3) either directly on the preparation cylinder 20, or in a special machine by taking the plate 10 off its support 20 and mounting it on a similar cylinder in the special machine.

The process for producing an inking plate according to the invention comprises the following steps:

- mounting a base plate on a preparation cylinder and clamping it by appropriate means;
- covering the clamping means with a cover;
- depositing a layer of adhesive on the surface of the base plate, except over the cover;
- depositing at least one layer of PVC on the layer of adhesive and on the cover;
- cutting the layer of PVC lying over the cover; and
- taking off the cover and removing the plate.

Figure 5:
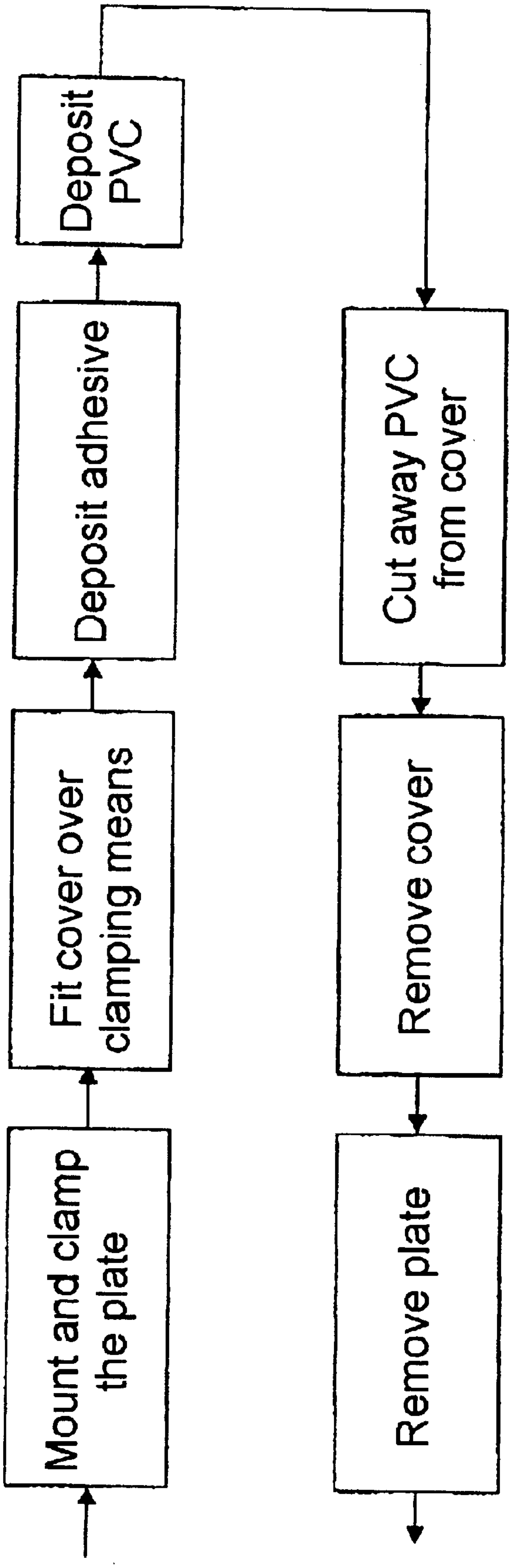
FIG. 5 is a block diagram illustrating the process for producing an inking plate according to the invention.

This process is illustrated in FIG. 5 by a block diagram containing the various steps.

It is preferable to use an adhesive such as "DECORRAL HF"™, although other equivalent adhesives are possible.

Examples of PVC compositions are as follows:

| Layer 15, 70 Shore A, shown in FIGS. 2 and 3: | |
|---|---|
| Hostalit 4472 | 1,100 g |
| Hostalit 9070 | 1,100 g |
| Vestinol AH (DOP) | 1,135 g |
| Paraplex G54 | 770 g |
| Calcium carbonate | 825 g |
| Prosper DBM | 45 g |
| Vinlub 73 | 10 g |
| Riccardi TPL | 10 g |

| Layer 26 or 27, 50 Shore D, shown in FIGS. 2, 3 or 4: | |
|---|---|
| Hostalit 4472 | 1,100 g |
| Hostalit 9070 | 1,250 g |
| Vestinol AH (DOP) | 1,200 g |
| Monomer X 980 | 375 g |
| Catalyst TBPB-50-FT (50%) | 8 cc |
| Prosper DBM | 50 g |
| Calcium carbonate | 125 g |
| Graphite | 40 g |

The applied thickness of the layer 15 of PVC will preferably be 5 mm, which can be deposited in two consecutive stages, each corresponding to a thickness of approximately 2.5 mm. Once this layer is deposited and the cylinder has cooled down, the surface can be ground before the second layer of PVC is deposited.

The thickness of layer 26 or 27 may be approximately 3 mm.

The embodiments of the invention are indicated by way of example, and variations within the claimed scope of protection are possible. For example, depending on the size of the plates and the dimensions of the inking cylinders, more than one plate may be mounted on each cylinder. It may even be particularly beneficial and advantageous to have the number of inking plates correspond with the number of plates to be inked: as all the plates are clamped by systems of grippers, the locations of the clamps of the inking and plate cylinders can be set to correspond so that utilization of the surfaces of the plates is optimized. Similarly, the thickness of the layers of PVC can be varied according to circumstances.

What is claimed is:

1. A process for producing an inking plate for a rotary printing machine, the inking plate having a substantially cylindrical form thus defining a inner, central area, and being formed of at least a base plate having an outer major surface directed away from the central area and two polymer materials defining two successive layers deposited on said base plate over a majority of the outer surface of the base plate thus defining an inner layer and an outer layer of deposited material, wherein exclusively the outer layer of the inking plate is cut so as to define relief surfaces having limits corresponding to the outlines of surfaces to be inked, the process comprising the following steps:

mounting a base plate on a preparation cylinder and clamping the base plate by appropriate means;

covering the clamping means with a cover;

depositing a layer of adhesive on the surface of the base plate, except over the cover;

depositing at least one layer of a polymer material on the layer of adhesive and on the cover;

cutting the polymer layer lying over the cover; and taking off the cover and removing the inking plate from the preparation cylinder.

2. The process as claimed in claim 1, in which two successive layers of two different PVC compositions are deposited.

3. The process as claimed in claim 1 or 2, in which reliefs corresponding to the areas to be inked are cut into the polymer layer.

* * * * *